United States Patent
Ru et al.

(10) Patent No.: US 10,623,044 B2
(45) Date of Patent: Apr. 14, 2020

(54) PHASE AND FREQUENCY DETECTION METHOD AND CIRCUIT

(71) Applicant: Avago Technologies General IP (Singapore) Pte. Ltd., Singapore (SG)

(72) Inventors: Zhiyu Ru, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/105,873

(22) Filed: Aug. 20, 2018

(65) Prior Publication Data
US 2020/0059260 A1    Feb. 20, 2020

(51) Int. Cl.
| | |
|---|---|
| *G01R 25/00* | (2006.01) |
| *H03D 13/00* | (2006.01) |
| *H04B 1/40* | (2015.01) |
| *H03L 7/08* | (2006.01) |
| *H03K 3/037* | (2006.01) |
| *H03L 7/093* | (2006.01) |
| *H03K 5/00* | (2006.01) |

(52) U.S. Cl.
CPC .............. *H04B 1/40* (2013.01); *H03K 3/037* (2013.01); *H03L 7/0802* (2013.01); *H03L 7/093* (2013.01); *H03K 5/00* (2013.01); *H03K 2005/00078* (2013.01)

(58) Field of Classification Search
CPC ........ H03D 13/004; H03K 5/26; G01R 25/00; H03L 7/0891; H03L 7/085
USPC .......................................................... 327/3, 12
See application file for complete search history.

(56) References Cited

U.S. PATENT DOCUMENTS

| | | | | |
|---|---|---|---|---|
| 6,049,233 A | * | 4/2000 | Shurboff | H03D 13/004 327/149 |
| 6,157,218 A | * | 12/2000 | Chen | G01R 25/00 327/5 |
| 6,924,704 B2 | * | 8/2005 | Chien | H03L 7/085 327/12 |
| 8,975,924 B2 | * | 3/2015 | Praamsma | H03D 13/004 327/12 |
| 2007/0240010 A1 | * | 10/2007 | Chang | H03L 7/0891 713/500 |
| 2015/0358004 A1 | * | 12/2015 | Shirai | H03K 3/356104 327/115 |

* cited by examiner

*Primary Examiner* — Anh Q Tra
(74) *Attorney, Agent, or Firm* — Morgan, Lewis & Bockius LLP

(57) ABSTRACT

An apparatus for phase and frequency detection (PFD) includes a first circuit to receive a first input pulse and to generate a first output pulse, the rising edge of which is triggered by a first rising edge of the first input pulse, and a second circuit coupled to the first circuit and configured to receive a second input pulse and to generate a second output pulse, the rising edge of which is triggered by a second rising edge of the second input pulse. The second output pulse has a falling edge carrying first information related to a first rising edge of the first input pulse. The first output pulse has a falling edge carrying second information related to a second rising edge of the second input pulse.

12 Claims, 3 Drawing Sheets

PHASE AND FREQUENCY DETECTION METHOD AND CIRCUIT

TECHNICAL FIELD

The present description relates generally to communications, and more particularly, to a phase and frequency detection method and circuit.

BACKGROUND

Phased-lock loop (PLL) circuits are widely used in communication systems, such as wireless and wired communication systems, and have various applications. Example applications of PLL circuits are in frequency multipliers, frequency translators, amplitude modulation (AM) and frequency modulation (FM) detectors, demodulators such as frequency shift keying (FSK) demodulators and other applications. An important functionality by a PLL circuit is phase and frequency detection, which is performed by a phase and frequency detection circuit.

A phase and frequency detection (PFD) circuit can be a first module of a PLL and along with the charge pump (CP) circuit, may take a substantial portion of the total PLL power consumption. Further, the Existing PFD circuits can cause the CP circuit consuming a large area. A PFD circuit leading to significantly lower power consumption and smaller chip area is desired.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, systems and configurations are described for phase and frequency detection (PFD). The disclosed PFD circuit can drastically reduce the power consumption, for example, by about 50 percent. The PFD circuit of the subject technology can further reduce the CP area to nearly half of the area consumed by the existing solutions. This is because the charge pump (CP) current and the associated filtering capacitors can be smaller (e.g., by about 50%). Further, for the same power and noise level of the PFD, CP and loop filter (LF) of a phased-lock loop (PLL), the area of the LF capacitors can be nearly reduced by half. The disclosed PFD circuit, at the same power consumption level, can reduce PFD-CP noise by at least 3 dB. The lower noise can result in a better system performance, for instance, better signal-to-noise ratio (SNR) and better bit error rate (BER). The disclosed PFD circuit can be employed in various devices and systems that use an analog PLL, for example, in network switches, data centers, high-speed physical layers (PHYs), Wi-Fi and Bluetooth, and set-top box circuits and systems.

Figure 1:
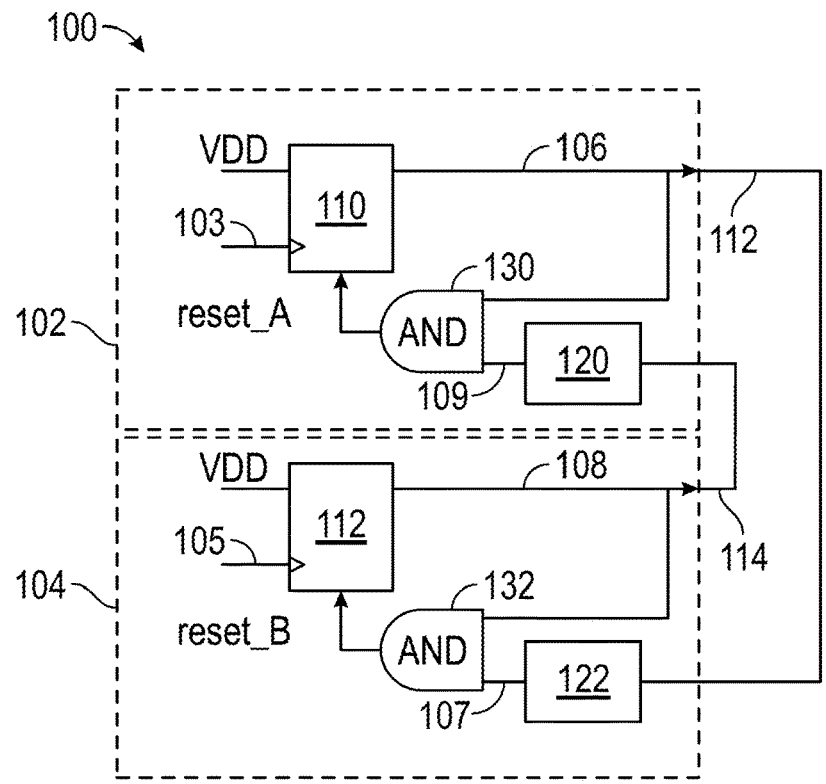
FIG. 1 is block diagram illustrating an example of a phase and frequency detection (PFD) circuit, according to aspects of the subject technology.

FIG. 1 is block diagram illustrating an example of a phase and frequency detection (PFD) circuit 100, according to aspects of the subject technology. The PFD circuit 100 includes a first circuit 102 and a second circuit 104. The first circuit 102 receives a first input pulse 103 and generates a first output pulse 106. The second circuit 104 is coupled to the first circuit 102 and receives a second input pulse 105 to generate a second output pulse 108. An output node 112 of the first circuit 102 is looped to the second circuit 104, and an output node 114 of the second circuit 104 is looped to the first circuit 102. The second output pulse has a second falling edge that carries first information related to a first rising edge of the first input pulse, as discussed herein.

The first circuit 102 includes a first flip-flop circuit 110, such as an edge-triggered flip-flop, a logic gate 130 and a delay circuit 120. The first flip-flop circuit 110 receives the first input signal 103 at its clock input, and its data input port is connected to a supply voltage VDD so that it is always at logic 1 level. Therefore, the first output 106 of the first flip-flop circuit 110 is controlled by the first input pulse 103 and the reset_A input. When the reset_A is set to logic 1 level, the first output 106 switches to logic 0 level.

In some implementations, the edge-triggered flip-flop is a D flip-flop. The logic gate 130 can be an AND logic gate. The delay circuit 120 is coupled between an output node 114 of the second circuit 104 and a second input node of the logic gate 130. The delay circuit 120 can delay the second output pulse 108 and provide a first delayed pulse 109 to the second input node of the logic gate 130. The logic gate 130 receives, at its first input node, the first output pulse 106 of the first flip-flop circuit 110. The logic gate 130 performs a logic AND operation between the first output pulse 106 and the first delayed pulse 109 and provides the result to a reset_A port of the first flip-flop circuit 110. In the implementation of FIG. 1, both of the reset_A and reset_B are active 1. In one or more implementations, one or both of the logic gates 130 and 132 can be NAND gates, and respectively, one or both of the reset_A and reset_B can be active 0.

The second circuit 104 is similar to the first circuit 102 and includes a second flip-flop circuit 112, a logic gate 132 and a delay circuit 122. In some implementations, the second flip-flop is an edge-triggered flip-flop, such as a D flip-flop. The second flip-flop circuit 112 receives the second input signal 105 at its clock input, and its data input port is connected to a supply voltage VDD so that it is always at logic 1 level. Therefore, the second output pulse 108 of the second flip-flop circuit 112 is controlled by the second input pulse 105 and the reset_B input. When the reset_B is set to logic 1 level, the second output 108 switches to logic 0 level.

The logic gate 132 can be an AND logic gate. The delay circuit 122 is coupled between an output node 112 of the first circuit 102 and a second input node of the logic gate 132. The delay circuit 122 can delay the first output pulse 106 and provide a second delayed pulse 107 to the second input node of the logic gate 132. The logic gate 132 receives, at its first input node, the second output pulse 108 of the second flip-flop circuit 112. The logic gate 132 performs a logic AND operation between the second output pulse 108 and the second delayed pulse 107 and provides the result to a reset_B port of the second flip-flop circuit 112.

Figure 2:
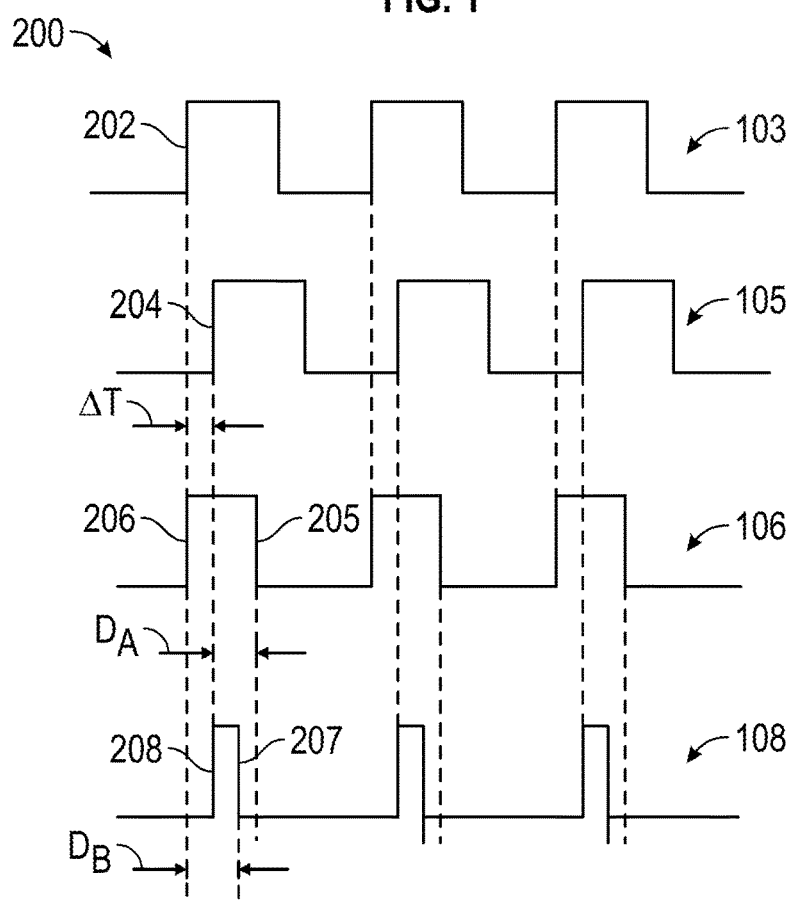
FIG. 2 is a time diagram illustrating example input and output pulses of a PFD circuit, according to aspects of the subject technology.

FIG. 2 is a time diagram 200 illustrating example input and output pulses of the PFD circuit 100 of FIG. 1, according to aspects of the subject technology. The time diagram 200 shows the first input and first output pulses 103 and 106 of the first circuit 102 and the first input and first output pulses 105 and 108 of the second circuit 104 of FIG. 1. The first input pulse 103 and the second input pulse 105 have a phase difference represented by the time delay ΔT. As described herein, the PFD circuit 100 can generate an output pulse that includes information related to the time delay ΔT, thus detecting the phase difference between the first input pulse 103 and the second input pulse 105.

The output pulse generated by the PFD circuit 100 can have a significantly shorter width than the first input pulse 103 and the second input pulse 105. This is because in many applications, the PFD circuit 100 is followed by charge pump circuit, for example, in a phased-locked loop (PLL) circuit, and its output controls a voltage-controlled oscillator (VCO) of the PLL. The narrower the output pulse generated by the PFD circuit 100, the less the noise is generated.

As shown in FIG. 2, and understood by analyzing operation of the flip-flop 110, logic gate 130 and the delay circuit 120, a rising edge 206 of the first output pulse 106 follows the rising edge 202 of the first input pulse 103. Further, a falling edge 205 of the first output pulse 106 follows a rising edge 204 of the second input pulse 105 with an addition of a delay $D_A$ of the delay circuit 120. Therefore, the rising edge 206 and the falling edge 205 of the first output pulse 106 carries information on the rising edges 202 and 204 of the input pulses 103 and 105. In other words, the width of the output pulse 106 can be approximately expressed as: $\Delta T + D_A$, which is an indication of the value of the ΔT, as the value of delay $D_A$ is fixed. In some implementations, the value of delay $D_A$ is less than about 100 psec. Typically, the frequency of the input pulses 103 and 105 is within a range of about 10 MHz to 10 GHz, thus the corresponding pulse widths are within a range of about 50 nsec to 50 psec (e.g., for a 50% duty cycle).

Similarly, as shown in FIG. 2, and understood by operation of the flip-flop 112, logic gate 132 and the delay circuit 122, a rising edge 208 of the second output pulse 108 follows the rising edge 204 of the second input pulse 105. And a falling edge 207 of the second output pulse 108 follows a rising edge 202 of the first input pulse 103 with an addition of a delay $D_B$ of the delay circuit 122 of FIG. 1. Therefore, the rising edge 208 and the falling edge 207 of the second output pulse 108 carries information on the rising edges 202 and 204 of the input pulses 103 and 105. In other words, the width of the output pulse 108 can be approximately expressed as: $D_B - \Delta T$, which is an indication of the value of the ΔT, as the value of delay $D_B$ is fixed. In some implementations, the value of delay $D_B$ is less than about 100 psec. In some implementations, the value of delay $D_B$ can be the same or different from the value of the delay $D_A$.

An advantageous feature of the PFD circuit 100 of FIG. 1 is that both rising edge and falling edges of the first and second output pulses 106 and 108 are useful, which enables double-edge phase and frequency detection. This is a significant improvement over the existing solutions, for which only the rising edges of the output pulses can carry phase information of the input pulses.

It is understood that variations of the PFD circuit 100 can be implemented (e.g., by inverting first output pulse 106 of FIG. 1) such that the falling edge 205 of the first output pulse 106 is triggered by the rising edge of 202 of the first input pulse 103, and the rising edge 206 of the first output pulse 106 be triggered by the rising edge 204 of the second input pulse 105. In some implementations of the PFD circuit 100, the rising edge 206 of the first output pulse 106 can be related to a falling edge of the first input pulse 103, and the falling edge 205 of the first output pulse 106 can be related to a falling edge of the second input pulse 105 (e.g., the flip-flops 110 and 112 of FIG. 1 respond to the falling edges of the first and second input pulses 103 and 105). In some implementations, the first output pulse 106 of FIG. 1 can be inverted and the flip-flops 110 and 112 of FIG. 1 can respond to the falling edges of the first and second input pulses 103 and 105. For these implementations, the falling edge 205 of the first output pulse 106 is triggered by the falling edge of the first input pulse 103, and the rising edge 206 of the first output pulse 106 is triggered by the falling edge of the second input pulse 105. In other implementations of the PFD circuit 100, other combinations of relations between rising and falling edges of output pulses 106 and 108 and input pulses 103 and 105 may be possible.

Figure 3:
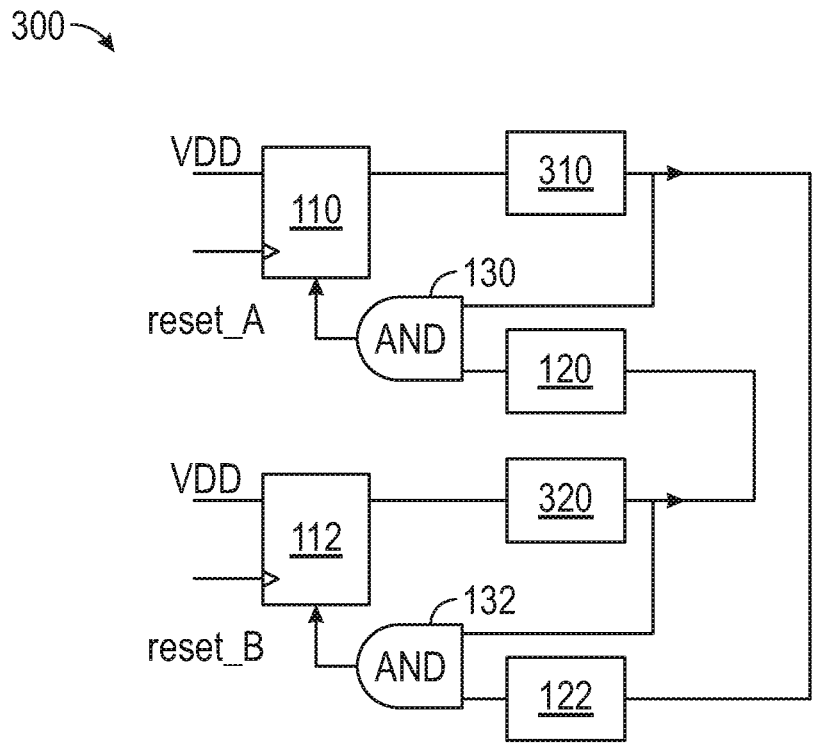
FIG. 3 is a block diagram illustrating an example of a PFD circuit with additional delay circuits, according to aspects of the subject technology.

FIG. 3 is a block diagram illustrating an example of a PFD circuit 300 with additional delay circuits 310 and 320, according to aspects of the subject technology. The PFD circuit 300 is similar to the PFD circuit 100 of FIG. 1, except for additional delay circuits 310 and 320. The delay circuit 310 is connected between an output of the first flip-flop 110 and a first input node of the logic gate 130. The delay circuit 320 is connected between an output of the second flip-flop 112 and a first input node of the logic gate 132.

Figure 4:
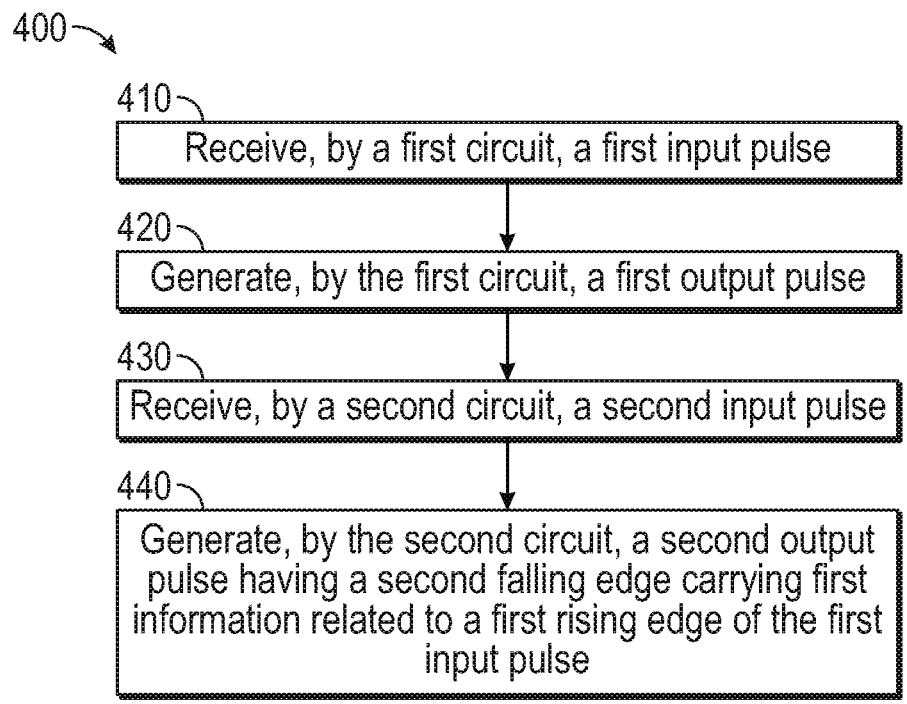
FIG. 4 is a flow diagram illustrating an example method for a phase and frequency detection, according to aspects of the subject technology.

FIG. 4 is a flow diagram illustrating an example method 400 for a phase and frequency detection, according to aspects of the subject technology. For explanatory purposes, the method 400 is primarily described herein with reference to the PFD circuit 100 and input and output pulses of FIGS. 1 and 2. However, the method 400 is not limited to the PFD circuit 100 and input and output pulses of FIGS. 1 and 2, and one or more blocks (or operations) of the method 400 may be performed by one or more other components of the PFD circuit 100 of FIG. 1. Further for explanatory purposes, the blocks of the example method 400 are described herein as occurring in serial, or linearly. However, multiple blocks of the example method 400 may occur in parallel. In addition, the blocks of the example method 400 need not be performed in the order shown in FIG. 4

The method 400 includes receiving, by a first circuit (e.g., 102 of FIG. 1), a first input pulse (e.g., 103 of FIGS. 1 and 2) (410). The method 400 further includes generating, by the first circuit, a first output pulse (e.g., 106 of FIGS. 1 and 2) (420). A second input pulse (e.g., 105 of FIGS. 1 and 2) is received by a second circuit (e.g., 104 of FIG. 1) (430). The second circuit can generate a second output pulse (e.g., 108 of FIGS. 1 and 2) having a second falling edge (e.g., 207 of FIG. 2) carrying first information related to a first rising edge (e.g., 202 of FIG. 2) of the first input pulse (440).

Figure 5:
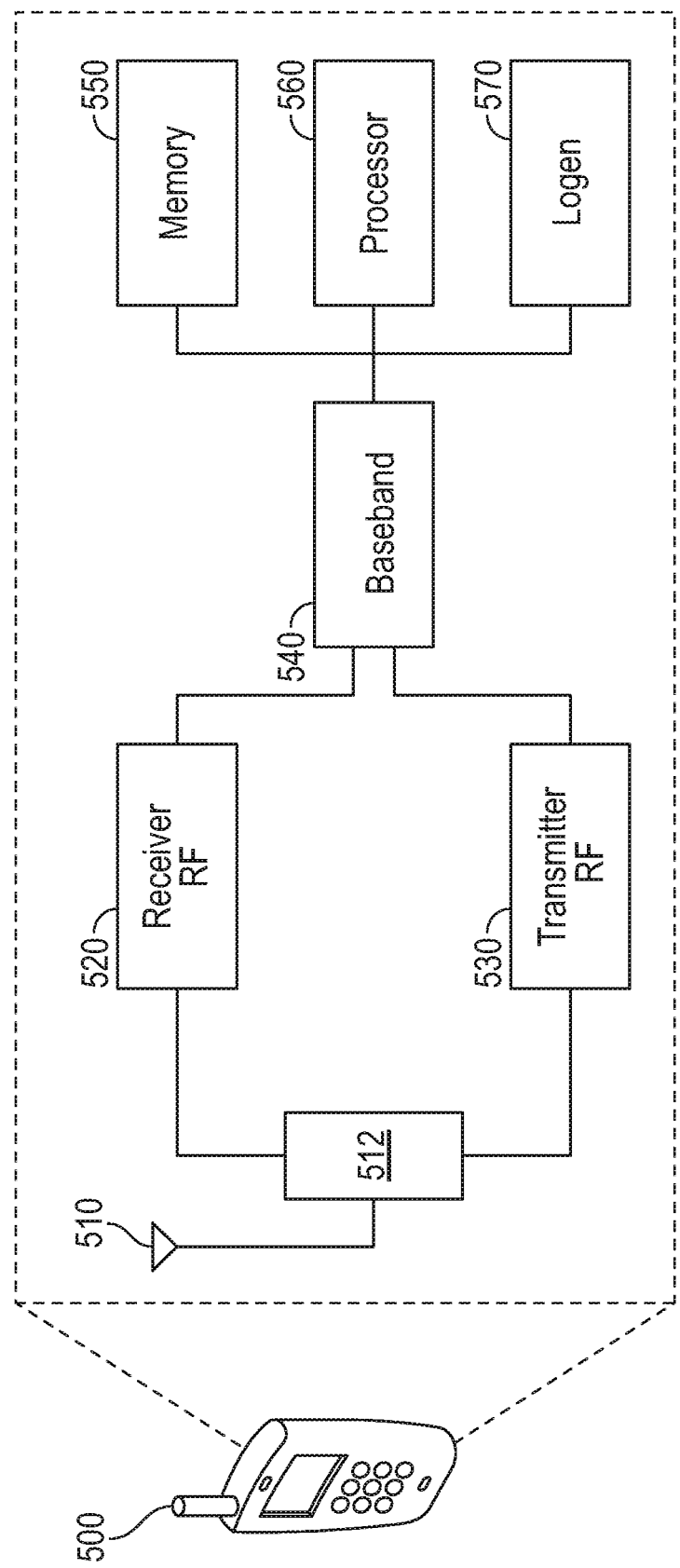
FIG. 5 is a block diagram illustrating an example of a wireless communication device using aspects of the subject technology.

FIG. 5 is a block diagram illustrating an example of a wireless communication device 500 using aspects of the subject technology. Although the subject technology can be employed in a wireless communication device such as the wireless communication device 500, its application is not limited to wireless communication devices and can be used in many wired communication devices such as cable and fiber optics communication devices and systems.

The wireless communication device 500 may comprise a radio-frequency (RF) antenna 510, a receiver 520, a transmitter 530, a baseband processing module 540, a memory 550, a processor 560, and a local oscillator generator (LOGEN) 570. In various embodiments of the subject technology, one or more of the blocks represented in FIG. 5 may be integrated on one or more semiconductor substrates. For example, the blocks 520-570 may be realized in a single chip or a single system on a chip, or may be realized in a multi-chip chipset.

The receiver 520 may comprise suitable logic circuitry and/or code that may be operable to receive and process signals from the RF antenna 510. In various embodiments of the subject technology, the receiver 520 may be operable to cancel noise in received signals and may be linear over a wide range of frequencies. In this manner, the receiver 520 may be suitable for receiving signals in accordance with a variety of wireless standards, Wi-Fi, WiMAX, Bluetooth, and various cellular standards. In various embodiments of the subject technology, the receiver 520 may not require any SAW filters and few or no off-chip discrete components such as large capacitors and inductors.

The transmitter 530 may comprise suitable logic circuitry and/or code that may be operable to process and transmit signals from the RF antenna 510. The transmitter 530 may, for example, be operable to up-convert baseband signals to RF signals and amplify RF signals. In various embodiments of the subject technology, the transmitter 530 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 530 may be operable to provide signals for further amplification by one or more power amplifiers. In some implementations, the receiver 520 and the transmitter 530 may use a PLL implemented using the PFD circuit 100 of FIG. 1 of the subject technology to benefit from a lower noise, higher SNR and lower BER of the subject technology.

The duplexer 512 may provide isolation in the transmit band to avoid saturation of the receiver 520 or damaging parts of the receiver 520, and to relax one or more design requirements of the receiver 520. Furthermore, the duplexer 512 may attenuate the noise in the receive band. The duplexer may be operable in multiple frequency bands of various wireless standards.

The baseband processing module 540 may comprise suitable logic, circuitry, interfaces, and/or code that may be operable to perform processing of baseband signals. The baseband processing module 540 may, for example, analyze received signals and generate control and/or feedback signals for configuring various components of the wireless communication device 500, such as the receiver 520. The baseband processing module 540 may be operable to encode, decode, transcode, modulate, demodulate, encrypt, decrypt, scramble, descramble, and/or otherwise process data in accordance with one or more wireless standards.

The processor 560 may comprise suitable logic, circuitry, and/or code that may enable processing data and/or controlling operation blocks of the wireless communication device 500. In this regard, the processor 560 may be enabled to provide control signals to various other portions of the wireless communication device 500. The processor 560 may also control transfers of data between various portions of the wireless communication device 500. Additionally, the processor 560 may enable implementation of an operating system or otherwise execute code to manage operation blocks of the wireless communication device 500.

The memory 550 may comprise suitable logic, circuitry, and/or code that may enable storage of various types of information such as received data, generated data, code, and/or configuration information. The memory 550 may comprise, for example, RAM, ROM, flash, and/or magnetic storage. In various embodiment of the subject technology, information stored in the memory 550 may be utilized for configuring the receiver 520 and/or the baseband processing module 540.

The local oscillator generator (LOGEN) 570 may comprise suitable logic, circuitry, interfaces, and/or code that may be operable to generate one or more oscillating signals of one or more frequencies. The LOGEN 570 may be operable to generate digital and/or analog signals. In this manner, the LOGEN 570 may be operable to generate one or more clock signals and/or sinusoidal signals. Characteristics of the oscillating signals such as the frequency and duty cycle may be determined based on one or more control signals from, for example, the processor 560 and/or the baseband processing module 540. In some implementations, the LOGEN 570 may use a PLL implemented using the PFD circuit 100 of FIG. 1 of the subject technology to benefit from a lower noise, higher SNR and lower BER of the subject technology.

In operation block, the processor 560 may configure the various components of the wireless communication device 500 based on a wireless standard according to which it is desired to receive signals. Wireless signals may be received via the RF antenna 510 and amplified and down-converted by the receiver 520. The baseband processing module 540 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 550, and/or information affecting and/or enabling operation of the wireless communication device 500. The baseband processing module 540 may modulate, encode and perform other processing on audio, video, and/or control signals to be transmitted by the transmitter 530 in accordance with various wireless standards.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the terms "comprise" as "comprise" is interpreted when employed as a transitional word in a claim.

What is claimed is:

1. An apparatus comprising:
   a first circuit comprising a first edge-triggered flip-flop, a first logic circuit, a first delay circuit, and a first inverter, wherein the first edge-triggered flip-flop is configured to receive a first input pulse and to generate a first output pulse; and
   a second circuit comprising a second edge-triggered flip-flop, a second logic circuit, and a second delay circuit, wherein the second edge-triggered flip-flop is configured to receive a second input pulse and to generate a second output pulse,
   wherein a first output of the first edge-triggered flip-flop is coupled to an input of the inverter, and an output of the inverter is coupled to a first input of the first logic circuit and to the second delay circuit,
   wherein a second output of the second edge-triggered flip-flop is coupled to a first input of the second logic circuit and to the first delay circuit,
   wherein an output of the first delay circuit is coupled to a second input of the first logic circuit and an output of the first logic circuit is coupled to a first reset input of the first edge-triggered flip-flop,
   wherein an output of the second delay circuit is coupled to a second input of the second logic circuit and an output of the second logic circuit is coupled to a second reset input of the second edge-triggered flip-flop,
   wherein the second output pulse has a second falling edge carrying first information related to a first rising edge of the first input pulse, and
   wherein a first falling edge of the first output pulse carries second information related to a second rising edge of the second input pulse.

2. The apparatus of claim 1, wherein the first circuit is configured to generate the first output pulse having a first falling edge triggered by a first rising edge of the first input pulse.

3. The apparatus of claim 1, wherein the second circuit is configured to generate the second output pulse having a second rising edge carrying the second information related to the second rising edge of the second input pulse.

4. The apparatus of claim 1, wherein the first logic circuit comprises a first AND logic circuit, and wherein the first information includes a second delay time of the second delay circuit.

5. The apparatus of claim 1, wherein the second logic circuit comprises a second AND logic circuit, and wherein the second information includes a first delay time of the first delay circuit.

6. A method of phase detecting, the method comprising:
   receiving, by a first flip-flop of a first circuit, a first input pulse;
   generating, by the first flip-flop of the first circuit, a first output pulse;
   inverting with an inverter the first output pulse and delaying the inverted first output pulse with a first delay circuit;
   receiving, by a second flip-flop of a second circuit, a second input pulse;
   generating, by the second flip-flop of the second circuit, a second output pulse; and
   delaying the second output pulse with a second delay circuit,
   wherein the first flip-flop is configured to reset based on an output of a first logic circuit with an output of the inverter coupled to a first input of the first logic circuit and an output of the second delay circuit coupled to a second input of the first logic circuit,
   wherein the second flip-flop is configured to be reset based on an output of a second logic circuit with an output of the second flip-flop coupled to a first input of the second logic circuit and an output of the first delay circuit coupled to a second input of the second logic circuit,
   wherein generating the second output pulse comprises generating the second output pulse having a second falling edge carrying first information related to a first rising edge of the first input pulse, and
   wherein generating the first output pulse comprises generating the first output pulse having a first falling edge carrying second information related to a second rising edge of the second input pulse.

7. The method of claim 6, wherein generating the first output pulse comprises generating the first output pulse having a first falling edge triggered by a first rising edge of the first input pulse.

8. The method of claim 6, wherein generating the second output pulse comprises generating the second output pulse having a second rising edge carrying information related to the second rising edge of the second input pulse.

9. The method of claim 6, wherein the first logic circuit comprises a first AND logic circuit, wherein the second logic circuit comprises a second AND logic circuit, and wherein the first information includes a second delay time of the second delay circuit.

10. The method of claim 9, wherein the second information includes a first delay time of the first delay circuit.

11. A communication device comprising:
a phased-lock loop (PLL) circuit configured to generate clock signals;
the PLL circuit comprising a phase and frequency detection (PFD) circuit comprising:
   a first circuit comprising a first edge-triggered flip-flop, a first logic AND circuit, a first delay circuit, and a second delay circuit, wherein the first circuit is configured to receive a first input pulse and to generate a first output pulse; and
   a second circuit comprising a second edge-triggered flip-flop, a second logic AND circuit, a third delay circuit, and a fourth delay circuit, wherein the second circuit is configured to receive a second input pulse and to generate a second output pulse,
wherein:
a first output of the first edge-triggered flip-flop is coupled to an input of the first delay circuit, and an output of the first delay circuit is coupled to a first input of the first logic AND circuit and to an input of the fourth delay circuit,
a second output of the second edge-triggered flip-flop is coupled to an input of the third delay circuit, and an output of the third delay circuit is coupled to a first input of the second logic AND circuit and to an input of the second delay circuit,
an output of the second delay circuit is coupled to a second input of the first logic AND circuit and an output of the first logic AND circuit is coupled to a first reset input of the first edge-triggered flip-flop,
an output of the fourth delay circuit is coupled to a second input of the second logic AND circuit and an output of the second logic AND circuit is coupled to a second reset input of the second edge-triggered flip-flop,
a second falling edge of the second output pulse carries first information related to a first rising edge of the first input pulse, and
a first falling edge of the first output pulse carries second information related to a second rising edge of the second input pulse.

12. The communication device of claim 11, wherein the first circuit is configured to generate the first output pulse having a first rising edge approximately coinciding with a first rising edge of the first input pulse; and wherein the second circuit is configured to generate the second output pulse having a second rising edge triggered by the second rising edge of the second input pulse.

* * * * *